United States Patent
Kumar et al.

(10) Patent No.: US 9,691,485 B1
(45) Date of Patent: Jun. 27, 2017

(54) STORAGE SYSTEM AND METHOD FOR MARGINAL WRITE-ABORT DETECTION USING A MEMORY PARAMETER CHANGE

(71) Applicant: SanDisk Technologies LLC, Plano, TX (US)

(72) Inventors: Chittoor Devarajan Sunil Kumar, Banglore (IN); Divya Prasad, Bengaluru (IN); Piyush Anil Dhotre, Bangalore (IN); Dharmaraju Marenahally Krishna, Bengaluru (IN); Thendral Murugaiyan, Bangalore (IN); Arun Thandapani, Bangalore (IN)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/207,151

(22) Filed: Jul. 11, 2016

(51) Int. Cl.
*G11C 16/10* (2006.01)
*G06F 3/06* (2006.01)

(52) U.S. Cl.
CPC .......... *G11C 16/105* (2013.01); *G06F 3/0619* (2013.01); *G06F 3/0653* (2013.01); *G06F 3/0688* (2013.01)

(58) Field of Classification Search
CPC .............................. G11C 16/04; G11C 16/105

USPC ..................................................... 365/185.12
See application file for complete search history.

(56) References Cited

U.S. PATENT DOCUMENTS

| | | | |
|---|---|---|---|
| 8,054,684 B2 * | 11/2011 | Gorobets | G11C 11/5628 365/185.03 |
| 8,151,034 B2 * | 4/2012 | Gorobets | G06F 11/1441 365/131 |
| 8,775,901 B2 * | 7/2014 | Sharon | G06F 11/1048 714/763 |
| 2011/0149651 A1 * | 6/2011 | Gorobets | G11C 11/5628 365/185.03 |

* cited by examiner

*Primary Examiner* — Harry W Byrne
(74) *Attorney, Agent, or Firm* — Brinks Gilson & Lione

(57) ABSTRACT

A storage system and method for marginal write-abort detection using a memory parameter change is provided. In one embodiment, a method for detecting a write abort is provided that is performed in a storage system having a memory. The method comprises reading a lower page in memory; determining if any data is written in the lower page; and in response to determining that no data is written in the lower page: increasing source voltage for memory cells in the lower page; re-reading the lower page; determining if a read failure exists in the re-read lower page; and in response to determining that a read failure exists in the re-read lower page, detecting a write abort. Other embodiments are possible, and each of the embodiments can be used alone or together in combination.

18 Claims, 7 Drawing Sheets

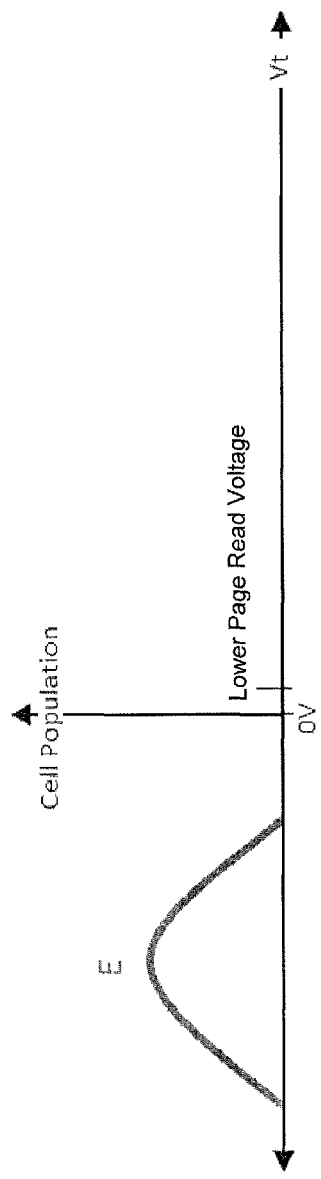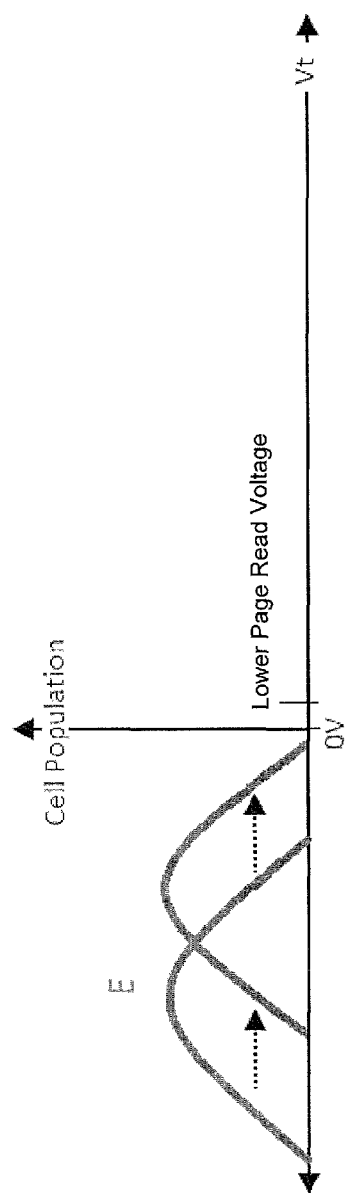

STORAGE SYSTEM AND METHOD FOR MARGINAL WRITE-ABORT DETECTION USING A MEMORY PARAMETER CHANGE

BACKGROUND

Some storage systems, especially removable storage systems such as USB, SD, and micro SD drives, have a high exposure to sudden power off or write-abort scenarios. If a write abort happens while actual data is being programmed to the memory cells, the storage system typically does not have a mechanism to record, at that instant, the fact that a write abort is taking place. Hence, during every initialization/power-up of the storage system, the storage system can scan all the open blocks to check for the first erased page in the block and identify the last-written page. If there was a write abort where power was cut-off after some amount of programming occurred, the last-written page in the block would give a read failure, and the storage system would detect that a write abort occurred on that page. Once a write abort is detected, the storage system could mark the block as write aborted and not allow any further programming of the block. Previous valid data in the block could be copied to another block as part of the write-abort handling process.

In storage modules with memory cells that can store more than one bit per cell, a lower page of data is typically first written in the memory cells, and then later, an upper page of data is written in the memory cells. To detect whether a lower page of data is erased, the storage system can read the lower page using a default read level close to 0 volts. If a certain number of memory cells provides voltage greater that this default level (the system "erase bit ignore" criteria), the lower page is detected as having a write abort; otherwise, the lower page is detected as being erased. In case there are memory cells between 0 volts and the default level, the storage system can move the lower page read voltage to 0 and read the page again. If a certain number of memory cells provides more than 0 volts, the lower page is detected as having a write abort; otherwise, the lower page is detected as being erased.

BRIEF DESCRIPTION OF THE DRAWINGS

FIG. 3 is a graph of cell population versus voltage of a typical erased page distribution of an embodiment.

FIG. 4 is a graph of cell population versus voltage of an embodiment when a write abort occurs within one programming loop/pulse.

DETAILED DESCRIPTION

Overview

Figure 1A:
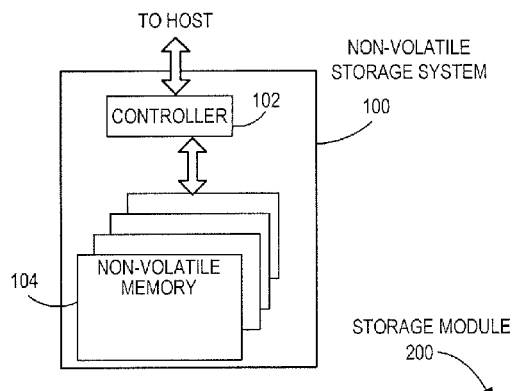
FIG. 1A is a block diagram of a non-volatile storage system of an embodiment.

By way of introduction, the below embodiments relate to a storage system and method for marginal write-abort detection using a memory parameter change. In one embodiment, a method for detecting a write abort is provided that is performed in a storage system having a memory. The method comprises reading a lower page in memory; determining if any data is written in the lower page; and in response to determining that no data is written in the lower page: increasing source voltage for memory cells in the lower page; re-reading the lower page; determining if a read failure exists in the re-read lower page; and in response to determining that a read failure exists in the re-read lower page, detecting a write abort.

In some embodiments, the method is performed during power-up of the storage system.

In some embodiments, the method further comprises programming the lower page in response to determining that a read failure exists in the re-read lower page.

In some embodiments, the storage system increases source voltage for memory cells in the lower page by setting a memory parameter in the memory.

In some embodiments, the storage system determines if a read failure exists in the re-read lower page by checking an error correction code associated with the re-read lower page.

In some embodiments, the memory is a three-dimensional memory.

In some embodiments, the storage system is embedded in a host.

In some embodiments, the storage system is removably connected to a host.

In another embodiment, a storage system is provided comprising a memory and a controller. The controller is configured to read a page in memory; determine whether the page is erased; in response to determining that the page is erased: change a memory parameter; re-read the page; perform a fail bit check on the re-read page; and in response to the fail bit check failing, determine that a write to the page was previously aborted.

In some embodiments, the controller is configured to perform the recited actions during power-up of the storage system.

In some embodiments, changing the memory parameter comprises raising memory cell source voltage for the page.

In some embodiments, the page is a lower page.

In some embodiments, the memory is a three-dimensional memory.

In some embodiments, the storage system is embedded in a host.

In some embodiments, the storage system is removably connected to a host.

In another embodiment, a storage system is provided comprising a memory an means for adjusting a memory parameter of memory cells in the memory to detect a write abort condition.

In some embodiments, the means comprises a controller.

In some embodiments, the memory parameter is memory cell source voltage.

In some embodiments, the memory is a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Exemplary Embodiments

Figure 1B:
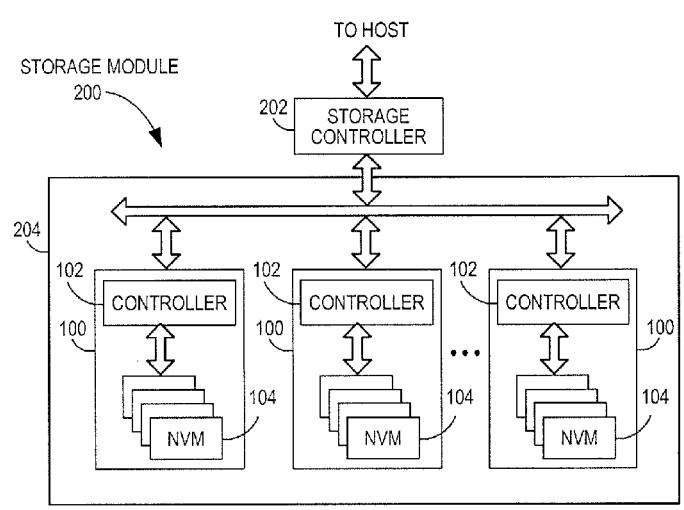
FIG. 1B is a block diagram illustrating an exemplary storage system of an embodiment.
Figure 1C:
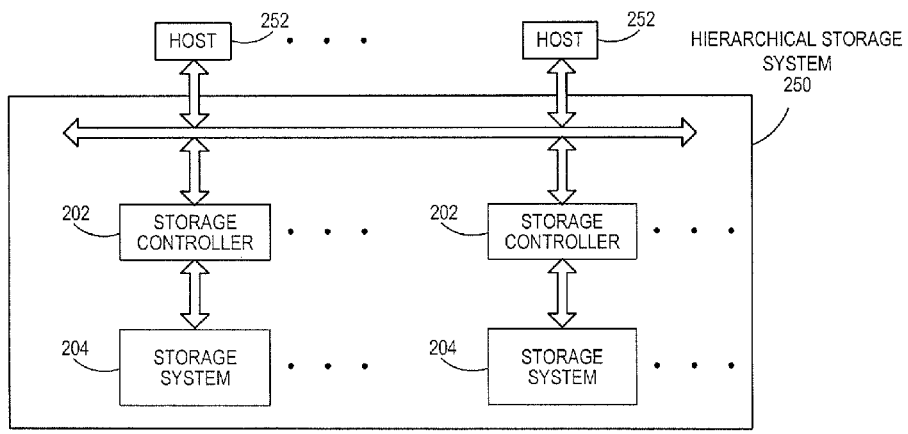
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
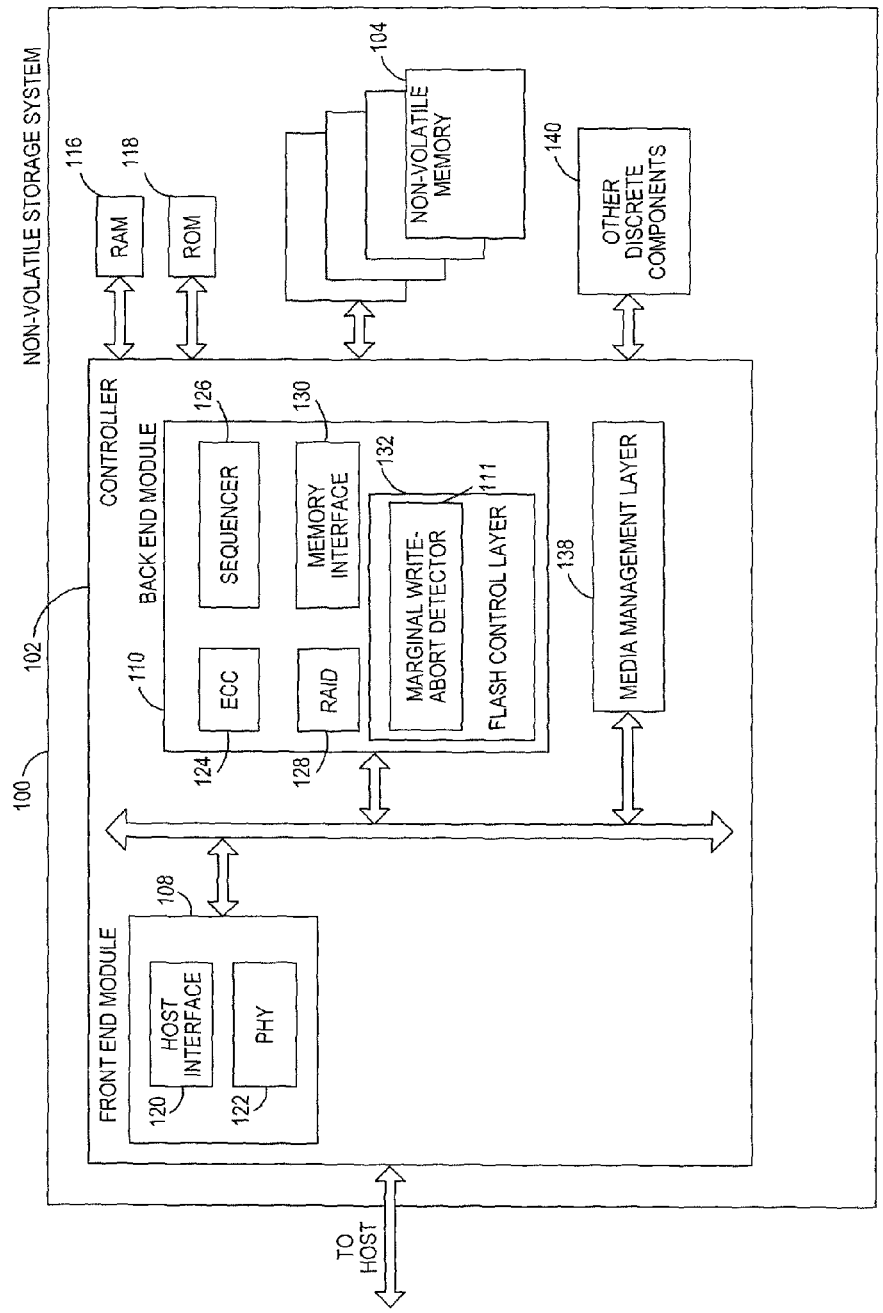
FIG. 2A is a block diagram illustrating exemplary components of the controller of the non-volatile storage system illustrated in FIG. 1A according to an embodiment.

FIG. 2A is a block diagram illustrating exemplary components of the controller 102 in more detail. Controller 102 includes a front end module 108 that interfaces with a host, a back end module 110 that interfaces with the one or more non-volatile memory die 104, and various other modules that perform functions which will now be described in detail. It should be noted, though, that a module, circuit, or monitor may take the form of a packaged functional hardware unit designed for use with other components, a portion of a program code (e.g., software or firmware) executable by a (micro)processor or processing circuitry that usually per-forms a particular function of related functions, or a self-contained hardware or software component that interfaces with a larger system, for example.

Referring again to modules of the controller 102, a buffer manager/bus controller (not shown) manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110. In one embodiment, the flash control layer 132 includes a marginal write-abort detector 111 that is configured to adjust a memory parameter (such as source voltage of memory cells) to detect a write abort condition in a page or part of a page, which would otherwise be considered erased. One implementation of the marginal write-abort detector 111 is discussed below and can be configured to execute the algorithm set forth in the flow chart provided herein.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
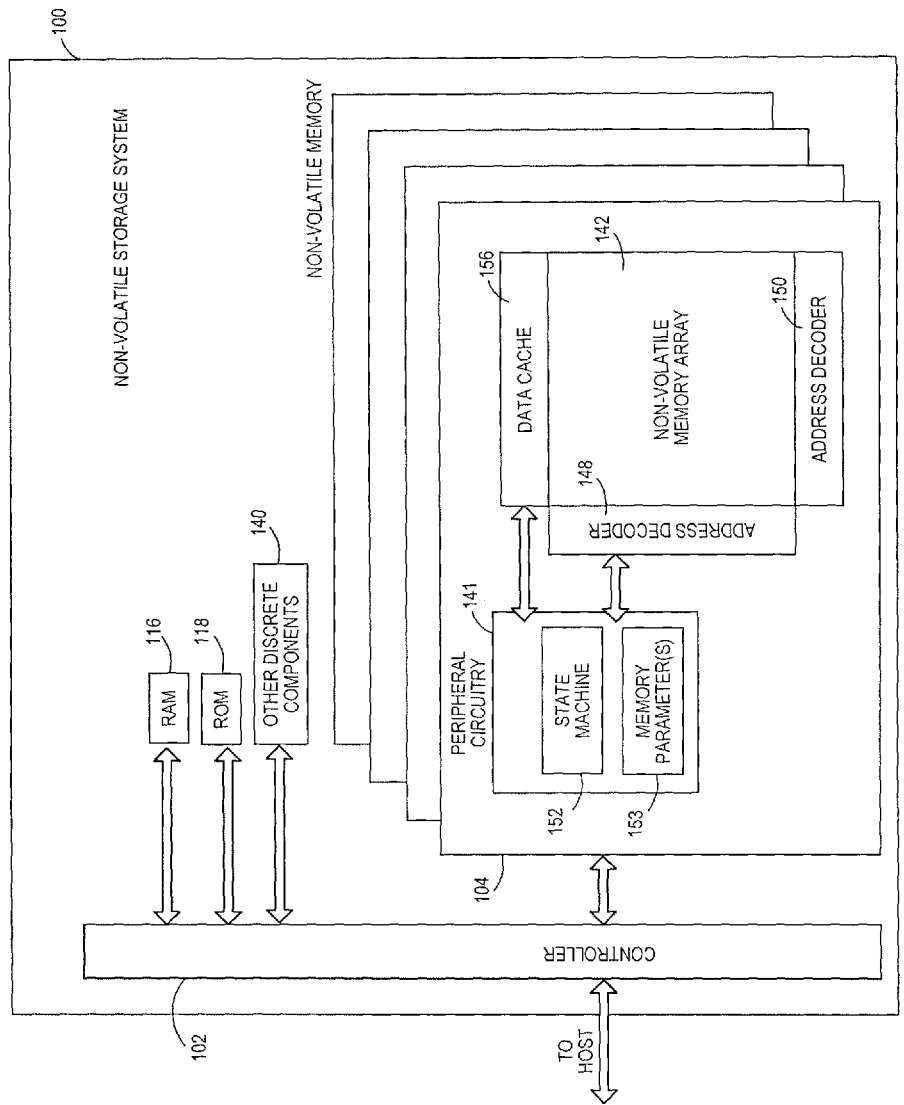
FIG. 2B is a block diagram illustrating exemplary components of the non-volatile storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102, as well as a storage unit for storing memory parameter(s) 153 (e.g., source voltage of memory cells).

In storage systems with memory cells that can store more than one bit per cell, a lower page of data is first written in the memory cells, and then later, an upper page of data is written in the memory cells. In one embodiment, there are 128 word lines in a block, and two pages (an upper page and a lower page) in each word line. In implementations where the memory 104 is operated to store two bits of data in each memory cell, each memory cell can be configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. So, in one implementation of using four charge levels to represent two bits of data in a memory cell, a value of "11" can correspond to an unprogrammed state of the memory cell. When programming pulses are applied to the memory cell to program a page bit of the lower page, the level of charge is increased to represent a value of "10" corresponding to a programmed state of the page bit of the lower page. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an unprogrammed state (a value of "11"), applying programming pulses to the memory cell to program the page bit of the upper page increases the level of charge to represent a value of "01" corresponding to a programmed state of the page bit of the upper page.

As discussed above, some storage systems, especially removable storage systems such as USB, SD, and microSD drives, have a high exposure to sudden power off or write-abort scenarios. If a write abort happens while actual data is being programmed to the memory cells, the storage system typically does not have a mechanism to record, at that instant, the fact that a write abort is taking place. Hence, during every initialization/power-up of the storage system, the storage system can scan all the open blocks to check for the first erased page in the block. If there was a write abort where power was cut-off after some amount of programming occurred, the last-written page in the block would give a read failure, and the storage system would detect that a write abort occurred on that page. Once a write abort is detected, the storage system could mark the block as write aborted and not allow any further programming of the block. Previous valid data in the block could be copied to another block as part of the write-abort handling process.

Write abort can be very marginal in nature, which can result in a "false positive" of indicating that a page or part of a page is erased when, in fact, it contains data. This is illustrated in FIGS. 3 and 4. FIG. 3 shows a graph of cell population versus voltage of a typical erased page distribution. Lower page read threshold voltage is a voltage that is close to 0 that is used to read a lower page to see if there is any programmed data in the page. As shown in FIG. 3, when a lower page is erased, all of its memory cells have a voltage that is less than the lower page read threshold voltage, so a read of the page will correctly indicate that the page is erased.

Figure 5:
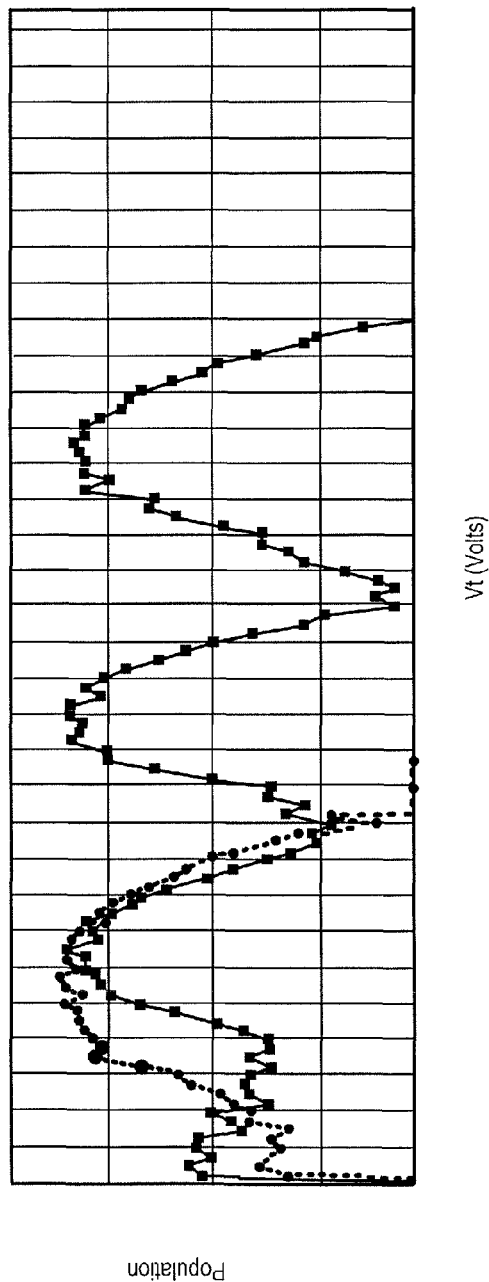
FIG. 5 is a graph of cell population versus voltage of an embodiment when marginal write abort is under detected and data is programmed on top of existing, but undetected, data in the lower and upper pages.

However, as shown in FIG. 4, when a write abort happens within one programming loop/pulse to the lower page, the erased distribution moves to the right but none of the memory cells cross 0 volts, much less lower page read threshold voltage. Accordingly, a read of this particular lower page during the next initialization or write-abort scan can indicate that the lower page is erased, which results in under-detection or misdetection of the write abort. In this situation, the storage system will allow the lower page and upper page on the word line to be programmed with data. This is illustrated in FIG. 5, which shows the distribution when marginal write abort is under detected and data is programmed on top of existing, but undetected, data in the lower and upper pages. In this drawing, the solid line represents upper page programming on a write-aborted page, and the dashed line represents lower page programming on a write-aborted page. Such programming can result in data loss, as lower page and upper page programming on a marginally-write-aborted word line can lead to more fail bit counts (FBCs). In other words, the programming status of the word line will indicate success, but subsequent reading of the word line can result in a failure. Accordingly, the existing methodology in some storage systems may not provide for a way to detect the marginally write-aborted distribution, which has a negative threshold voltage ($V_t$).

The following embodiments can be used to detect this marginal write abort scenario. In general, these embodiments take advantage of the fact that the memory 104 has configurable memory parameter(s) that can be adjusted in reading a lower page of the memory 104 to detect a write abort condition in the lower page, which would otherwise be considered erased. In one particular embodiment, the configurable memory parameter is the memory cell source voltage, although other parameters can be used. This parameter will be discussed in more detail in conjunction with FIG. 6.

Figure 6:
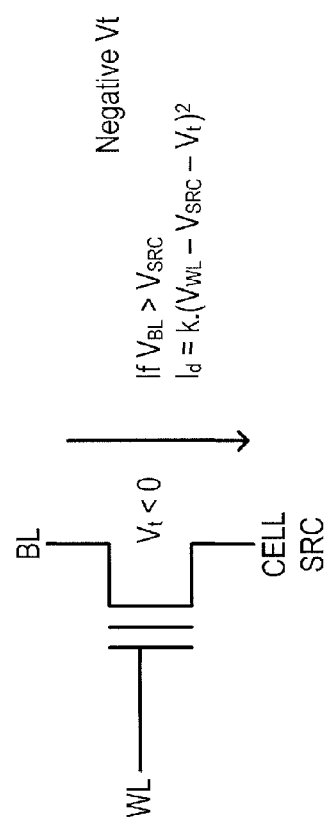
FIG. 6 is an illustration of a memory cell of an embodiment.

FIG. 6 depicts a schematic of a NAND cell of an embodiment. Although NAND is used in this example, it should be understood that other memory technologies can be used. The current flowing through the memory cell is a function of word line voltage ($V_{WL}$), memory cell source voltage ($V_{SRC}$), and cell voltage ($V_t$), as expressed in the equation in the figure. If the cell source voltage is increased above the word line voltage, the effective word line bias ($V_{WL}-V_{SRC}$) becomes negative. If $V_{WL}$ is fixed to a constant positive value, at a certain $V_{SRC}$, $V_t=V_{WL}-V_{SRC}$. At this point, the memory cell current, Id, becomes 0. This is true even if the cell $V_t$ is negative. In a NAND sensing scheme of an embodiment, if the memory cell current is 0, the memory cell is detected as programmed. Thus, increasing the cell source voltage results in a positive word line voltage, thereby detecting the negative $V_t$.

As shown in FIG. 6, the memory cell source voltage can be increased to detect the negative threshold voltage ($V_t$) of a memory cell. So, when the source voltage of the memory cell is increased, a positive word line voltage can be used to detect the negative $V_t$. Thus, increasing the value of this parameter shifts the $V_t$ of cells towards right, which ultimately cross 0 V. When a sufficient number of cells cross 0 V, the default read at the lower page read threshold voltage will detect it as a write aborted page and trigger write abort handling. The default value of the cell source voltage parameter can be restored after the write-abort detection is complete.

Figure 7:
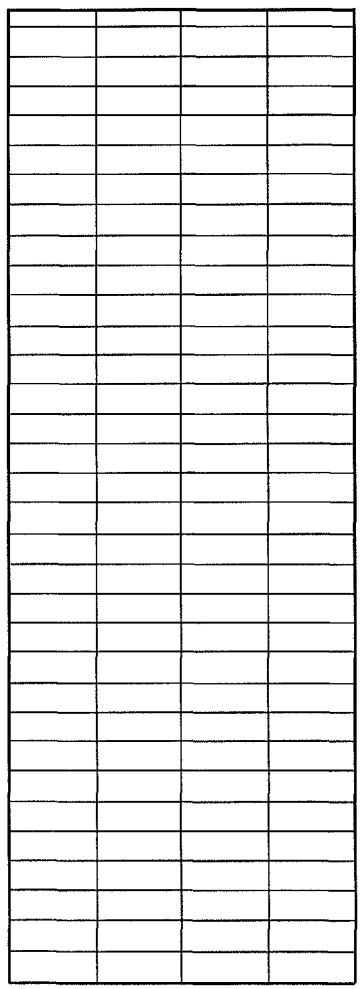
FIG. 7 is a graph of cell population versus voltage.
Figure 8:
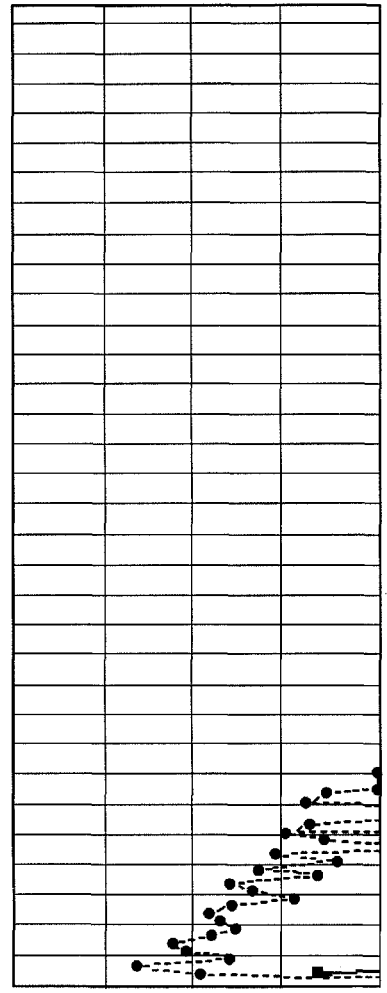
FIG. 8 is a graph of cell population versus voltage when using a marginal write-abort detection method of an embodiment.

FIGS. 7 and 8 show the implication of this embodiment. FIG. 7 is a graph of the distribution of memory cells of a write-aborted page after one cycle of lower page programming. As can be seen from this graph, hardly any bits are above 0 V. In contrast, FIG. 8 is a graph of the same distribution after increasing the memory cell source voltage parameter. As can be seen from this graph, increasing the cell source voltage helps in shifting the negative $V_t$ of the cells. Now, there are many cells above 0 volts (or the lower page read threshold voltage). So, reading this page will give sufficient number of bit flips (0), and this page will be detected as write aborted.

Figure 9:
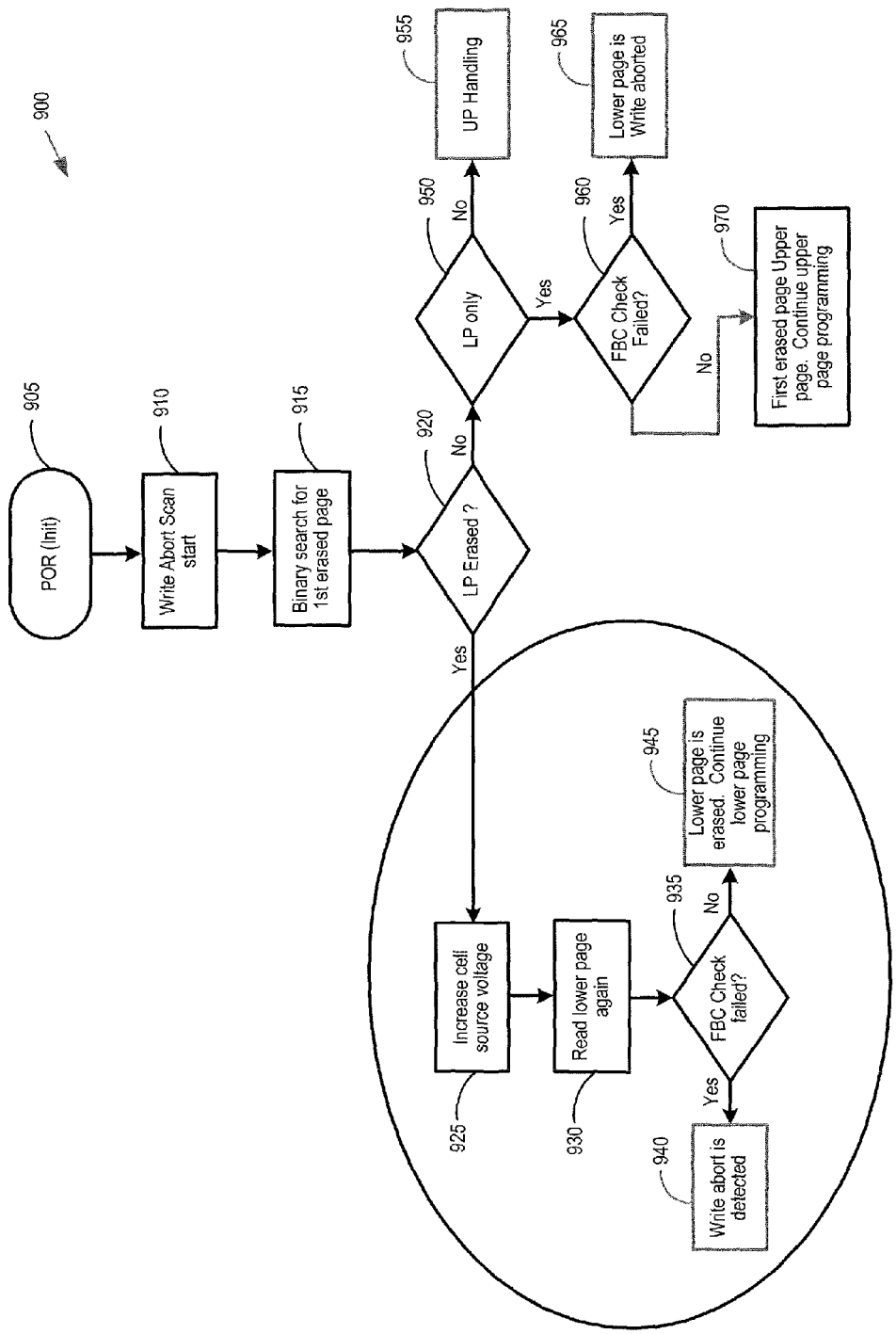
FIG. 9 is a flowchart of a marginal write-abort detection method of an embodiment.

These embodiments can be implemented using any suitable methods, and FIG. 9 is a flowchart 900 of one suitable method. Of course, other methods can be used. The algorithm shown in this flowchart 900 can be executed by the controller 102 (in general, or by the marginal write-abort detector 111) or another component in the storage system 100. As shown in FIG. 9, this particular method is performed during a power-on reset (or initialization) of the storage system 100 (act 905). The process begins with the storage system 100 performing a write abort scan to find open blocks in the memory 104 (act 910). When an open block is found, the storage system 100 does a binary search for the first erased page (act 915). The storage system 100 then determines if the lower page of that first erased page is erased (act 920). The storage system 100 can do this by looking to see if there are any programmed memory cells (or a number of memory cells above a threshold) in the lower page (e.g., to see if all the returned data is FF). If there are programmed memory cells, the lower page would not be considered erased, and acts 950 to 970 would be performed to determine if only the lower page has data (act 950) (in which case, an upper page handling process is performed (act 955)). If only the lower page has data, the storage system 100 can determine if the data is actually written data by checking to see if the fail bit count check failed (act 960). If it did, the lower page is write aborted (act 965). If it is not, the page is the first erased upper page, and the storage system 100 continues with upper page programming (act 970).

Returning to act 920, if the storage system 100 determines that the lower page is erased, it could continue with programming the lower page. However, as discussed above, this determination that the lower page is erased can be inaccurate, and programming the lower page in such a situation can result in a loss of data. So, the acts in the circle in FIG. 9 can be performed to more accurately determine whether the lower page is actually erased. As shown in FIG. 9, the storage system 100 first increases the memory cell source voltage (act 925). As discussed above, increasing the cell source voltage helps in shifting the negative V, of the cells. The actual amount of increase of the cell source voltage can be determined when calibrating the storage system 100 during manufacturing or in the field.

The storage system 100 then reads the lower page again (act 930). This time, many cells are above the 0 volts (lower page read threshold voltage) threshold. Still, the storage system 100 preferably would like to know whether these bits represent actual data or if they are just random bits. To do this, the storage system 100 can determine if a read error occurred when reading the lower page. For example, the storage system 100 can perform a fail bit count check (act 935), such as checking to see if there are any (sufficient) errors when decoding the read data with an error correction code (ECC) associated with the data. If the check is unsuccessful (i.e., if the FBC check fails), this indicates that real data was written, and a write abort is detected (act 940). On the other hand, if the check succeeds, there are just random bits in the lower page, in which case the storage system 100 erases the lower page and continues with lower page programming (act 945).

There are several advantages associated with these embodiments. As discussed above, with these embodiments, a write-aborted lower page can be detected in situations where it would otherwise be considered erased. Accordingly, the disclosed marginal write abort detection mechanism can detect such scenarios precisely and avoid data loss for the user. These embodiments also improve the overall quality of the storage system and are especially beneficial for original equipment manufacturer (OEM) products, which have tighter defective-parts-per-million (DPPM) requirements. These embodiments are also beneficial for retail products that have a high exposure to write-abort scenarios.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for detecting a write abort, the method comprising:
performing the following in a storage system having a memory:
reading a lower page in memory;
determining if any data is written in the lower page; and
in response to determining that no data is written in the lower page:
increasing source voltage for memory cells in the lower page;
re-reading the lower page;
determining if a read failure exists in the re-read lower page; and
in response to determining that a read failure exists in the re-read lower page, detecting a write abort.

2. The method of claim 1, wherein the method is performed during power-up of the storage system.

3. The method of claim 1 further comprises programming the lower page in response to determining that a read failure exists in the re-read lower page.

4. The method of claim 1, wherein the storage system increases source voltage for memory cells in the lower page by setting a memory parameter in the memory.

5. The method of claim 1, wherein the storage system determines if a read failure exists in the re-read lower page by checking an error correction code associated with the re-read lower page.

6. The method of claim 1, wherein the memory is a three-dimensional memory.

7. The method of claim 1, wherein the storage system is embedded in a host.

8. The method of claim 1, wherein the storage system is removably connected to a host.

9. A storage system comprising:
a memory; and
a controller in communication with the memory, wherein the controller is configured to:
read a lower page in memory;
determine if any data is written in the lower page; and
in response to determining that no data is written in the lower page:
increase source voltage for memory cells in the lower page;
re-read the lower page;
determine if a read failure exists in the re-read lower page; and
in response to determining that a read failure exists in the re-read lower page, detect a write abort.

10. The storage system of claim 9, wherein the controller is configured to read the lower page during power-up of the storage system.

11. The storage system of claim 9, wherein the controller is configured to program the lower page in response to determining that a read failure exists in the re-read lower page.

12. The storage system of claim 9, wherein the controller is configured to increase source voltage for memory cells in the lower page by setting a memory parameter in the memory.

13. The storage system of claim 9, wherein the controller is configured to determine if a read failure exists in the re-read lower page by checking an error correction code associated with the re-read lower page.

14. The storage system of claim 9, wherein the memory is a three-dimensional memory.

15. The storage system of claim 9, wherein the storage system is embedded in a host.

16. The storage system of claim 9, wherein the storage system is removably connected to a host.

17. A storage system comprising:
a memory;
means for reading a lower page in memory;
means for determining if any data is written in the lower page; and
means for in response to determining that no data is written in the lower page:
increasing source voltage for memory cells in the lower page;
re-reading the lower page;
determining if a read failure exists in the re-read lower page; and
in response to determining that a read failure exists in the re-read lower page, detecting a write abort.

18. The storage system of claim 17, wherein the memory is a three-dimensional memory.

* * * * *